United States Patent [19]
Marbot

[11] Patent Number: 5,521,540
[45] Date of Patent: May 28, 1996

[54] METHOD AND APPARATUS FOR MULTI-RANGE DELAY CONTROL

[75] Inventor: Roland Marbot, Versailles, France

[73] Assignee: Bull, S.A., Paris, France

[21] Appl. No.: 451,717

[22] Filed: May 26, 1995

Related U.S. Application Data

[63] Continuation of Ser. No. 355,813, Dec. 14, 1994, abandoned, which is a continuation of Ser. No. 27,480, Mar. 8, 1993, abandoned.

[30] Foreign Application Priority Data

Mar. 24, 1992 [FR] France .................. 92 03526

[51] Int. Cl.⁶ .................................. H03H 11/26
[52] U.S. Cl. .......................... 327/277; 327/170; 327/276; 327/278; 327/284; 327/355
[58] Field of Search .................. 307/263, 269, 307/498, 529, 597, 602, 603, 170, 276, 277, 278, 28, 285, 355

[56] References Cited

U.S. PATENT DOCUMENTS

| | | | |
|---|---|---|---|
| 4,737,670 | 4/1988 | Chan | 307/603 |
| 4,797,586 | 1/1989 | Traa | 307/603 |
| 4,820,944 | 4/1989 | Herlein et al. | 307/603 |
| 4,845,390 | 7/1989 | Chan | 307/603 |
| 4,922,141 | 5/1990 | Lofgren et al. | 307/603 |
| 5,087,829 | 2/1992 | Ishibashi et al. | 307/269 |
| 5,260,608 | 11/1993 | Marbot | 307/262 |

*Primary Examiner*—Terry Cunningham
*Attorney, Agent, or Firm*—Kerkam, Stowell, Kondracki & Clarke; Edward J. Kondracki

[57] ABSTRACT

A method and apparatus for multi-range delay control is disclosed. A method furnishes an output signal ($S_K$) with a delay that is variable with respect to an input signal ($e_0$). To enable precise adjustment as a function of a set-point delay (CN) over a plurality of scales, a succession of signals ($e_1$, $e_2$, ..., $e_n$) delayed with respect to the input signal ($e_0$) are produced, the delay between a delayed signal ($e_2$) and the preceding signal ($e_1$) having a predetermined value. One of the delayed signals ($e_2$) and a preceding signal ($e_1$) as selected and a superposition is performed with weighting and an integral effect of the selected signals ($e_1$, $e_2$), the selection and weighting being determined as a function of the set-point delay (CN).

9 Claims, 6 Drawing Sheets

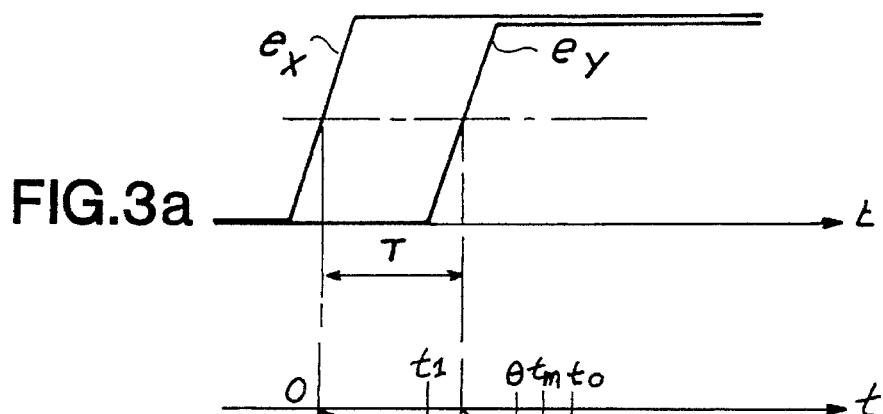
FIG.3a
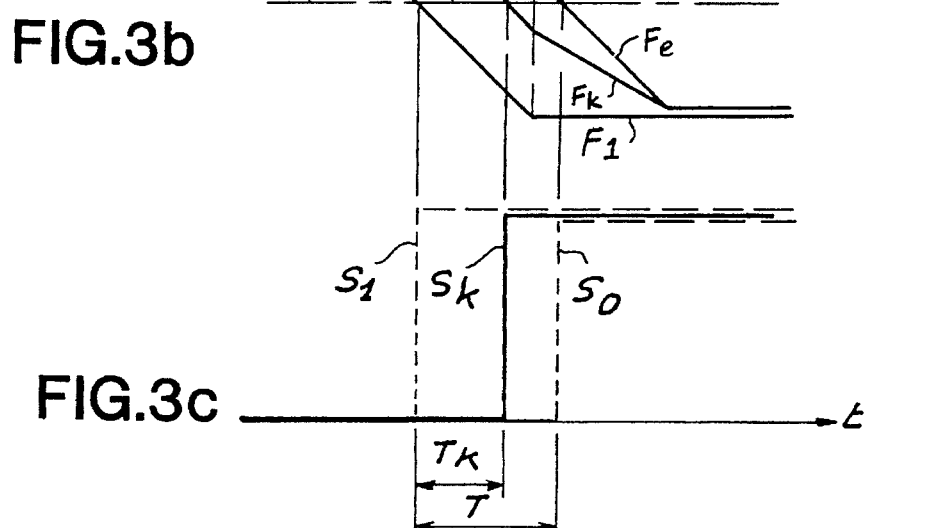
FIG.3b
FIG.3c
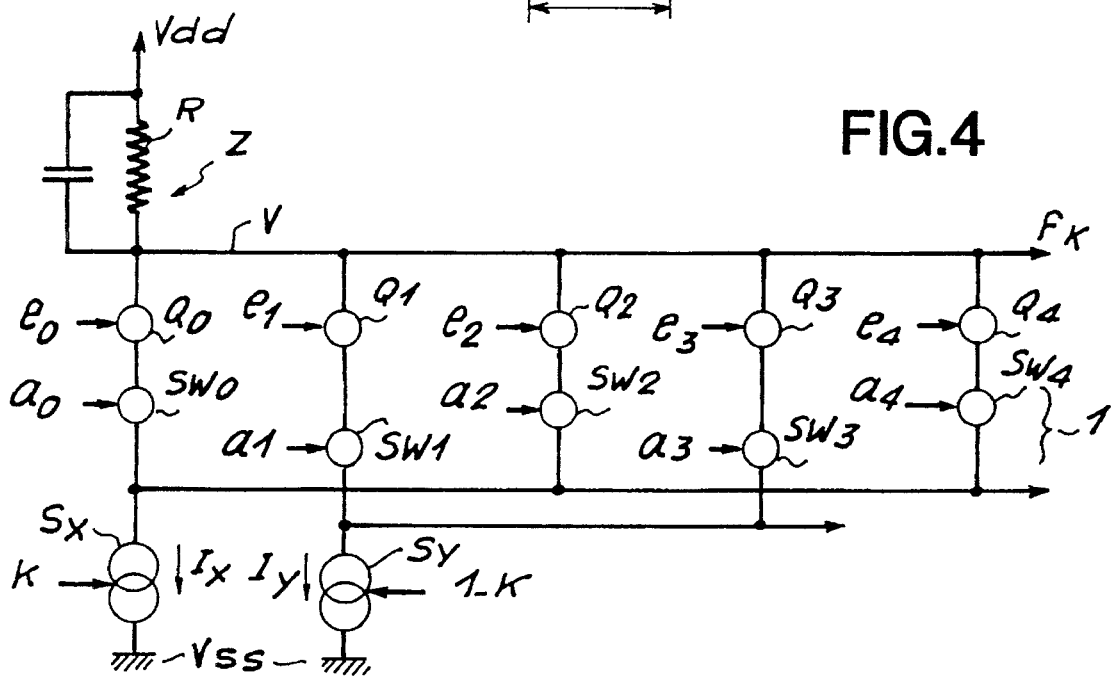
FIG.4

METHOD AND APPARATUS FOR MULTI-RANGE DELAY CONTROL

This application is a continuation of application Ser. No. 08/355,813, filed Dec. 14, 1994, now abandoned, which is a continuation of application Ser. No. 08/027,480, filed Mar. 8, 1993, now abandoned.

FIELD OF THE INVENTION

The invention relates to delay devices that are adjustable as a function of a set-point delay, which may be in the form of a digital variable.

BACKGROUND OF THE INVENTION

Adjustable delay circuits have numerous applications and are used in particular when the phase between two logical signals is to be adjusted. In that case, the first of these signals is applied to the input of a delay circuit, and measuring the phase displacement between the output signal and the input signal is used to control the adjustment of the delay circuit.

Automatic phase control can be done by means of an analog or digital adjusting signal; the digital version is often preferred, because it is less sensitive to interference and to the attenuation involved in signal transmission. Moreover, when it is embodied as an integrated circuit, it is less sensitive to production variations.

A first known way to achieve a digitally controlled delay circuit consists in using a plurality of elementary gates, for example of the inverter type, associated with a digitally controlled interconnection system and enabling the cascade connection of a variable number of elementary gates. However, this type of circuit is limited to being employed in cases that do not require precision adjustment of any delay shorter than the intrinsic delay of the elementary gate.

Another known solution is to use a circuit of the resistor-capacitor type, where the resistor is constituted by a plurality of elementary resistors connected selectively in parallel as a function of the digital control. In that case, the delay is defined by the time constant of the circuit. If all the elementary resistors have the same resistance, then the delay obtained is inversely proportional to the number of resistors selected. To obtain a constant adjustment precision over the entire adjustment range, it is necessary for the function linking the delay to the digital adjustment variable to be as nearly as possible a linear function. The response obtained by the above solution is accordingly very far from a linear relationship. To approach such linearity, the elementary resistors must be dimensioned for quite precise resistances that are are all different from one another. This outcome is very difficult to obtain in the case of an integrated version, however. Moreover, it would be necessary to provide one such circuit for each signal that is to be adjusted.

For example, if the delay circuit is intended to be used in a phase-locked loop of the type described in European Patent Application published under No. 441 684, filed Jan. 30, 1991, and entitled "Circuit verrouillé en phase et multiplieur de fréquence en résultant" (PHASE-LOCKED LOOP AND RESULTANT FREQUENCY MULTIPLIER), corresponding to U.S. application Ser. No. 07/762,018, filed Sep. 18, 1991, in the name of Roland Marbot and assigned to the assignee of the present invention, then the foregoing solution is not satisfactory, because of its bulk and its sensitivity to production variations.

A method consisting in performing a superposition with weighting and an integral effect of the input signal and a signal delayed by a fixed value with respect to the input signal enables precise adjustment, with the possibility of obtaining a minimum delay shorter than the intrinsic delay of the elementary gates for the technology chosen. By limiting the value of the fixed delay, this solution also assures a linear response, with a good approximation, of the delay as a function of the digital command. The range of adjustment of the delay is then equal to the value of the fixed delay. For certain applications, it is desirable to be capable of adjusting the delay over a wide range. However, if the value of the fixed delay is increased beyond a certain value depending on the dimensions of the combination circuit, then the response of the delay as a function of the digital command becomes less and less linear, and finally has a discontinuity.

SUMMARY OF THE INVENTION

The object of the invention is to overcome the above disadvantages, by proposing a solution that enables both precise and linear adjustment, with a good approximation, and the possibility of obtaining a minimum delay of low value, while making an expanded adjustment range possible.

To this end, the subject of the invention is a method for furnishing an output signal having a delay with respect to an input logic signal, the delay being adjustable as a function of a digital command, characterized in that it consists in producing a succession of signals delayed with respect to the input signal, the delay between an delayed signal and the preceding signal having a predetermined value; selecting one of the delayed signals and the preceding signal; and performing a superposition with weighting and an integral effect of the selected signals, the selection and the weighting being determined as a function of the digital command.

The method according to the invention accordingly defines a plurality of adjustment scales, the selection of a predetermined scale being made by selecting one of the delayed signals and the preceding signal.

To obtain a delay that varies continuously as a function of the digital command despite the passage from one scale to another, the method according to the invention is further characterized in that the weighting consists in assigning two complementary weighting coefficients, respectively, to the two signals selected as a function of the digital command, which are between 0 and a maximum value.

The subject of the invention is also a delay circuit for employment of the method according to the invention. This circuit is characterized in that it includes selection means for selecting one of the delayed signals and the preceding signal and combination means for furnishing a combination signal resulting from the superposition with weighting and an integral effect of the selected signals, the selection means and combination means being controlled by a control circuit as a function of the digital command.

The subject of the invention is also several embodiments especially designed to be capable of using ECL and CMOS technologies.

BRIEF DESCRIPTION OF THE DRAWINGS

These embodiments and other aspects and advantages of the invention will become apparent from the ensuing description, taken in conjunction with the drawings.

FIG. 3 shows timing diagrams with which the operation of the circuit of FIG. 2 can be explained.

FIG. 4 shows the basic layout of an ECL version of the delay circuit according to the invention.

DETAILED DESCRIPTION OF THE PREFERRED EMBODIMENTS

Figure 1:
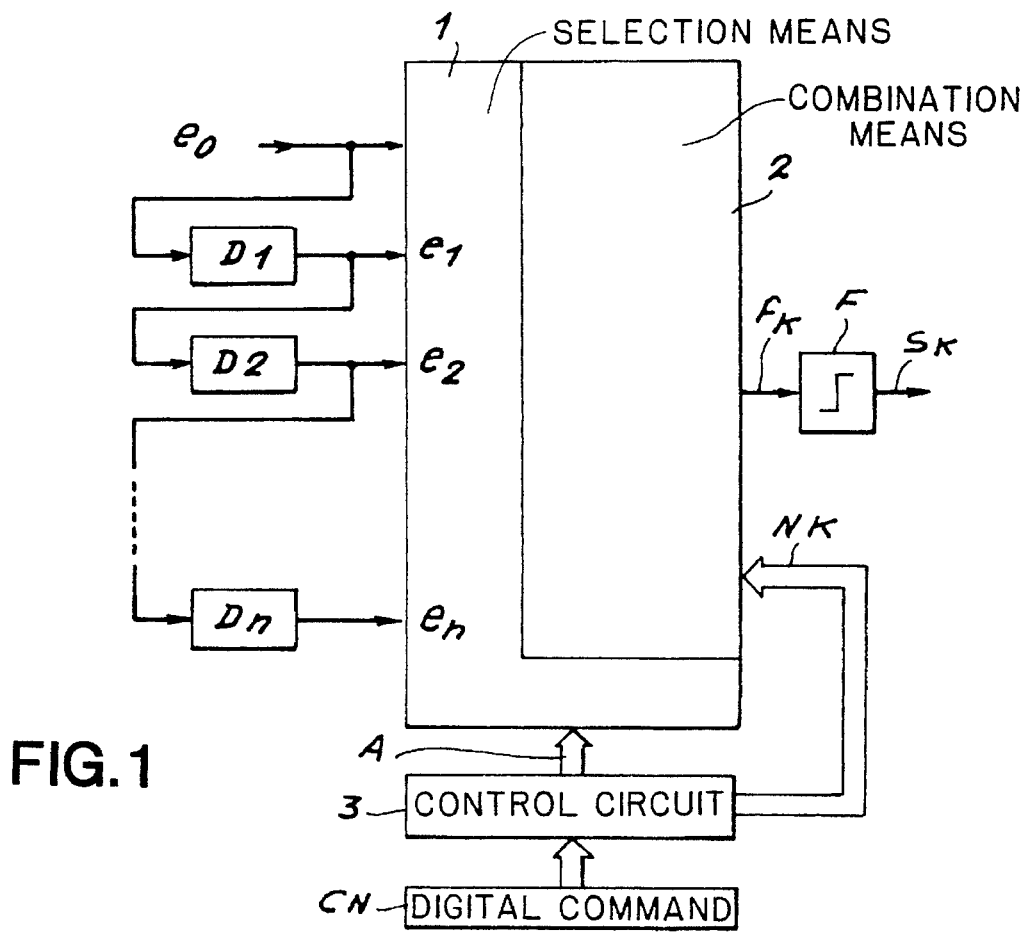
FIG. 1 shows the basic layout of the delay circuit according to the invention.

The delay circuit according to the invention is schematically shown in FIG. 1. A plurality of circuits D1, D2, ..., Dn with a fixed delay are connected in cascade fashion; with the first fixed delay circuit D1 receiving an input signal $e_0$ at its input. The fixed delay circuits D1, D2, ..., Dn furnish delayed signals $e_1, e_2, ..., e_n$ at their outputs.

The input signal $e_0$ as well as the delayed signals $e_1$-$e_n$ are applied to the input of selection means 1 and combination means 2 that are controlled respectively as a function of selection signals A and weighting signals NK by a control circuit 3. At its input, the control circuit 3 receives the digital command CN, which can assume the form of a binary digital variable.

The combination means 2 furnish at their output a combination signal $f_K$, which is applied to the input of a shaping circuit F, the output of which furnishes the logical output signal $s_K$.

The circuit of FIG. 1 functions as follows. As a function of the digital command value CN, the control circuit 3 furnishes the signals A for selecting one of the delayed signals, as well as the signal that precedes it in the chain of fixed delay circuits D1, ..., Dn. The selection signals A accordingly define the adjustment scale necessitated by the digital command CN. On the other hand, the control circuit 3 furnishes the weighting signals NK as a function of the low weight of the digital command CN. These signals NK will define the weighting coefficients applied to the combination means 2.

Figure 2:
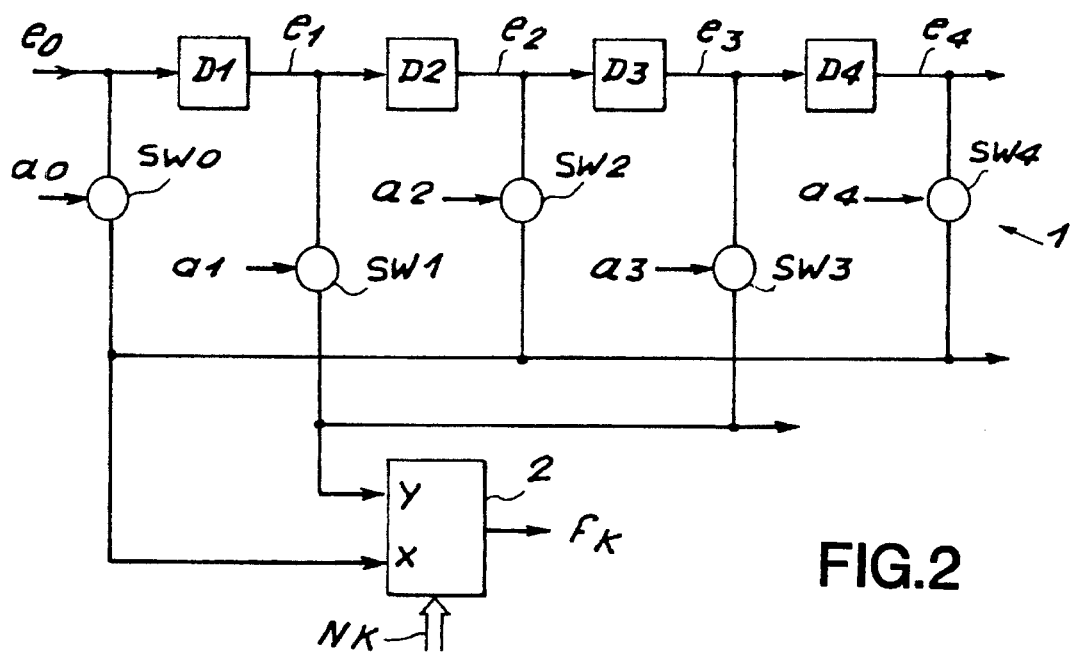
FIG. 2 shows a first variant embodiment of the circuit of FIG. 1.

FIG. 2 shows a first possibility of arranging the selection means 1 with respect to the combination means 2. To simplify the ensuing explanation, the number of delayed signals and fixed delay circuits associated with them will be limited to four, on the understanding that the invention is not limited to this particular case and may easily be generalized for any arbitrary number of delayed signals. Moreover, positive logic will be used, and it will be assumed that the switches are opened or closed depending on whether the signals that control them are 0 or 1 respectively.

In the embodiment shown in FIG. 2, the combination means are constituted by a single combination circuit 2 including two inputs X and Y intended for receiving two successive signals from among the set of signals $e_0, ..., e_4$. The combination circuit 2 receives the weighting signals NK and at its output furnishes the combination signals $f_K$. The input X of the combination circuit 2 is connected to the input signal $e_0$ and to the even-numbered delayed signals $e_2$, $e_4$ by way of the respective switches SW0, SW2, SW4, controlled respectively by the selection signals $a_0$, $a_2$, $a_4$. The input Y of the circuit 2 is connected to the odd-numbered delayed signals $e_1$, $e_3$ by way of the respective switches SW1, SW3, controlled respectively by the selection signals a1, a3.

In operation, for an adjustment range predetermined as a function of the digital command CN, the control circuit 3 activates two successive switches, for example SW0 and SW1, in such a way as to enable the combination circuit 2 to perform the superposition with an integral effect and weighting of the two signals $e_0$, $e_1$ selected.

To facilitate the ensuing explanation, standardized variables of the signals involved will be used, and it is assumed that the weighting coefficients assigned to the signals selected are complementary and are between 0 and 1. Hence the coefficient applied to the signal received by the input X of circuit 2 will have a value K that is variable between 0 and 1, while the coefficient applied to the signal received by the input Y will assume the value 1–K.

Under these conditions, the circuit 2 is designed to perform the combination KX+(1–K)Y with integration with respect to time.

The timing diagrams shown in FIG. 3 make it possible to explain the operation of the combination circuit 2.

The timing diagram (a) shows the signals selected $e_x$ and $e_y$ from among the signals $e_0$–$e_4$ and applied respectively to the inputs X and Y of the circuit 2. The signals $e_x$, $e_y$ normally have a steep transition edge between a first and a second level, which is followed by another edge (not shown) that returns the signal to its first level. In practice, this edge is defined by the instant when the signal reaches a threshold value, generally corresponding to the intermediate level between the minimum and maximum levels of the signal.

If it is assumed, for example, that the selection signals a0 and a1 are active, then the signals $e_x$ and $e_y$ will be the signals $e_0$ and $e_1$, respectively. The signal $e_y$ will then be identical to the signal $e_0$, but delayed by the delay T defined by the delay circuit D1.

The timing diagram (b) shows the combination signal $f_K$ for different values of the weighing coefficient K. It is understood that the form of the signals shown is a simplified representation of the signals that may be obtained with actual circuits. Nevertheless, it is appropriate to note that this illustration is not far from reality. In particular, a saturation stage will always be observed, because the integral of a pulse in any case is finally limited to the values of the supply potentials.

The signal $f_1$ corresponds to the case where K=1, or in other words when the weighting coefficient applied to the signal $e_1$ is zero. This signal is trapezoidal in form, with the leading edge beginning at time 0, corresponding to the instant when the signal $e_0$ reaches the threshold value. The signal $f_1$ decreases linearly until time tm, where it reaches a saturation stage.

The signal $f_0$ corresponds to the case where the weighting coefficient K applied to the signal $e_0$ is zero. This signal reproduces the signal $f_1$ with the delay T.

For weighting coefficients different from these two extreme cases, the combination signal has the course represented by the curve $f_K$.

The signals $f_1$ and $f_0$ reach the threshold value at times t1 and t0, respectively, while the signal $f_K$ reaches this threshold at time $\Theta$. The interval between t1 and t0 is equal to the delay T. Hence the minimum and maximum delays, respectively, of the combination signal $f_K$ with respect to the input signal $e_0$ are between t1 and t0, respectively. Consequently, the delay obtained in the general case will have a value Θ between t1 and t1+T.

The timing diagram (c) shows the output signal of the shaping circuit F in each of the three cases shown in the timing diagram (b). Hence the signals $s_1$ and $s_0$ have an edge at times t1 and t0, respectively. For a given coefficient K, the output signal $f_K$ will have an edge delayed by a value of $T_K$ with respect to the signal $s_1$, the value $T_K$ being between 0 and T.

The way in which the delay Θ varies as a function of the weighting coefficient K depends essentially on the transition time tm defined above and on the fixed delay T. The transition time tm will define the minimum delay t1 of the output signal $s_K$ with respect to the input signal $e_0$. In the perfectly linear case as shown, this minimum delay is equal to half the transition time.

If the variations in the delay $T_K$ as a function of the coefficient K are investigated for different values of the transition time tm and of the fixed delay T, it is found that T must be less than tm, to prevent any discontinuity of the delay $T_K$ as a function of the weighting coefficient K and hence of the digital command. On the other hand, a perfectly linear response of the delay $T_K$ as a function of K is obtained as soon as T is less than or equal to tm/2. Hence for a fixed value of tm, a linear response will be obtained, with the widest possible adjustment range, when T is equal to tm/2.

For a given selection of a delayed signal and of the preceding signal, the fixed delay T determines the range of adjustment of the delay. Hence for a predetermined range, it will be possible to obtain a linear response by selecting tm equal to 2T. However, it might be necessary to select a short transition time, in order to reduce the minimum delay t1 which depends directly on the transition time tm.

In general, the selection of T and of tm will be the result of a compromise between the minimum delay, the adjustment range for a selected scale and the linearity of the delay with respect to the digital command.

As a result of the disposition shown in FIG. 2, the passage from one scale to another does not cause any discontinuity at all in the adjustment of the delay as a function of the digital command, if provision is made so that the coefficient K will vary as a function of the digital command CN by a decreasing or increasing function, respectively, depending on whether the delayed signal selected is even- or odd-numbered. How this result is obtained in practice will be seen later, with respect to FIGS. 9 and 10.

FIG. 4 shows a different basic layout of the selection and combination means, with a view to an ECL embodiment.

The circuit shown is supplied by two supply potentials Vdd and Vss, corresponding to a positive potential and ground, respectively. An impedance Z formed by a resistor R and a parallel capacitor has a first terminal connected to the positive potential Vdd and a second terminal connected to two current sources Sx and Sy, by way of respective switches Q0, SW0, Q2, SW2, Q4, SW4, and Q1, SW1, Q3, SW3. The switches of the same even number are connected in series and are connected to the first current source Sx, while the switches of the same odd number are connected in series and connected to the second current source Sy. The switches Q0–Q4 are controlled by the signals $e_0$–$e_4$, respectively, and the switches SW0–SW4 are controlled respectively by the selection signals a0–a4. The current sources Sx and Sy are adjustable current sources, controlled by the weighting coefficients K and 1–K, respectively, and furnishing currents Ix and Iy, respectively, which are complementary and are proportional to the corresponding weighting coefficients.

This assembly thus achieves a superposition of the currents Ix and Iy in the impedance Z, whose capacitance is responsible for the integration effect.

The potential V of the second terminal constitutes the measurement of the combination signal $f_K$, and the time constant of the impedance Z will make it possible to define the transition time tm.

The operation of the circuit of FIG. 4 may be explained with the aid of the timing diagrams of FIG. 3, assuming that the signals $e_0$ and $e_1$ are selected, for example.

Initially, until time 0, since the signals $e_0$ and $e_1$ are at 0, the potential V is equal to Vdd. When $e_0$ changes to 1, the switch Q0 closes, and a current I0=KI circulates in the impedance Z. The potential V then decreases, with the time constant of the impedance Z, toward the value Vdd–KRI, during a period of time equal to the fixed delay T. The signal $e_1$ then changes to 1, Q1 closes, and a current (1–K)I is added to the current KI in the impedance Z. The potential V then continues to charge toward the value Vdd–RI, with the same time constant and a current I.

Subsequently, $e_0$ changes back to 0, and Q0 opens. The potential V then charges toward to Vdd–(1–K)RI during the period T with the same time constant and a current (1–K)I. Finally, $e_1$ changes back to zero, Q0 opens, and the potential V continues to rise to Vdd.

The circuit accordingly performs the superposition, with an integral effect, of the variables $Ke_0$ and $(1-K)e_1$. Naturally, the signals $f_1$, $f_0$ and $f_K$ in reality have variations that are more progressive than those shown in FIG. 3(b), particularly in the vicinity of the saturation stage. Nevertheless, this difference does not substantially modify the results obtained, if the transition time tm is defined as the time interval during which the signals $f_1$ and $f_0$ vary practically linearly as a function of the time.

Figure 5:
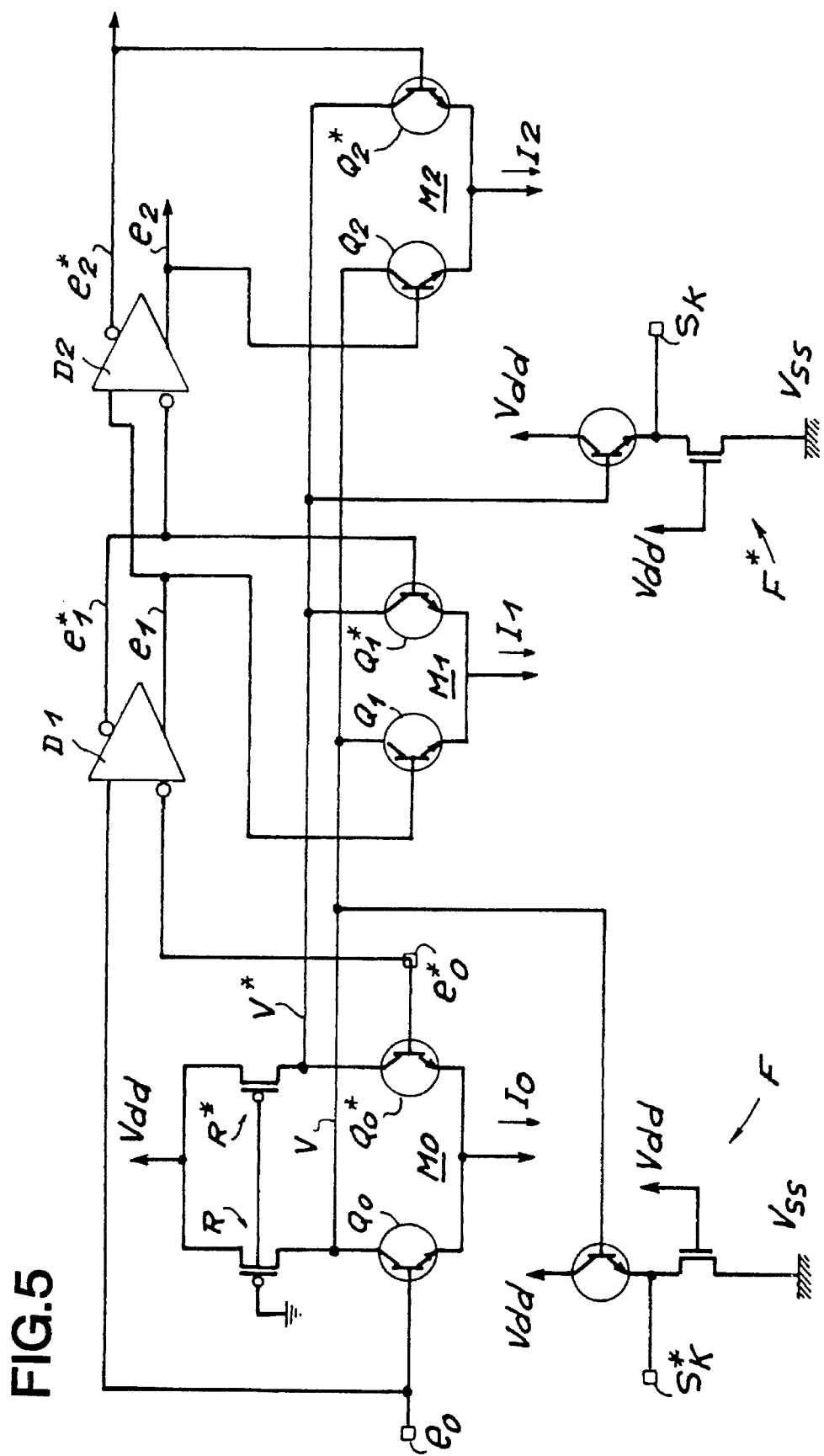
FIGS. 5 and 6 show a detailed ECL embodiment.

FIG. 5 shows an ECL version of the combination circuit 2. This circuit includes two resistors R, R*, of the same value, embodied for example by MOS transistors, each having a first terminal connected to the supply potential Vdd. A first differential array M0 is formed of two bipolar transistor M0, Q0*, whose collectors are connected to the second terminal of the resistors R and R*, respectively, and whose emitters are supplied with a current I0. A second differential array M1, identical to M0, is formed of bipolar transistors Q1 and Q1*, whose collectors are connected to the second terminal of the resistors R and R*, respectively, and whose emitters are supplied with a current I1.

The input signal is a differential signal $e_0$, $e_0$*, controlling the bases of the transistors Q0 and Q0*. The differential signal $e_0$, $e_0$* is also applied to the input of a differential amplifier D1, which plays the role of the fixed delay circuit. The amplifier D1 furnishes a delayed differential signal e1, e1* controlling the bases of the transistors Q1 and Q1*. The delayed differential signal $e_1$, $e_1$* is applied to the input of a second differential amplifier D2, also serving as a fixed delay circuit. The amplifier D2 furnishes a second delayed differential signal $e_2$, $e_2$* controlling the bases of the transistors Q2 and Q2* of a third differential array M2, identical to M0 and M1 and connected in the same way. The emitters of the transistors Q2 and Q2* are supplied with a current I2.

The differential voltage V, V* between the two terminals of the resistors R and R* constitutes the measurement of the combination signal. Two emitter follower arrays F, F* are controlled by the differential combination signal V, V* and at their output furnish a differential output signal $s_K$, $s_K$*.

It is certainly possible to provide other differential amplifier and differential arrays disposed downstream, to increase the number of adjustment scales.

As a function of the adjustment scale selected, only two predetermined nearby differential arrays will be supplied with current, with the current of the even and odd modules being proportional to K and 1−K, respectively.

The operation of the circuit of FIG. 5 will easily be deduced from that of FIG. 4, except that the signals are of the differential type. It should be noted that the impedance Z of FIG. 4 is formed for each path of the resistor R or R* and of the set of capacitances which are connected to the resistor, such as the collector-to-base capacitances of the bipolar transistors. In the case where the resistors R and R* are formed by MOS transistors, it is also appropriate to take the drain-to-gate capacitances of these transistors into account.

Contrary to the embodiment of FIG. 2, the embodiments of FIGS. 4 and 5 make it unnecessary to make a direct selection of the delayed signals. This feature makes it possible to reduce the minimum delay, on the condition that the number of scales will not be overly high, because the capacity and hence the time constant increases with the number of differential arrays. The selection among the arrangements of FIGS. 2 or 4 and 5 will then depend on the relative importance that is assigned to the minimum delay and to the adjustment range. Naturally, if the choice bears on the arrangement of FIG. 2, then the combination circuit 2 can use the ECL version of FIG. 5 with only differential arrays M0 and M1 with selection circuits for the differential signals $e_0$, $e_0^*$&, ..., $e_4$, $e_4^*$ to be applied to the inputs of the arrays M0 and M1.

Figure 6:
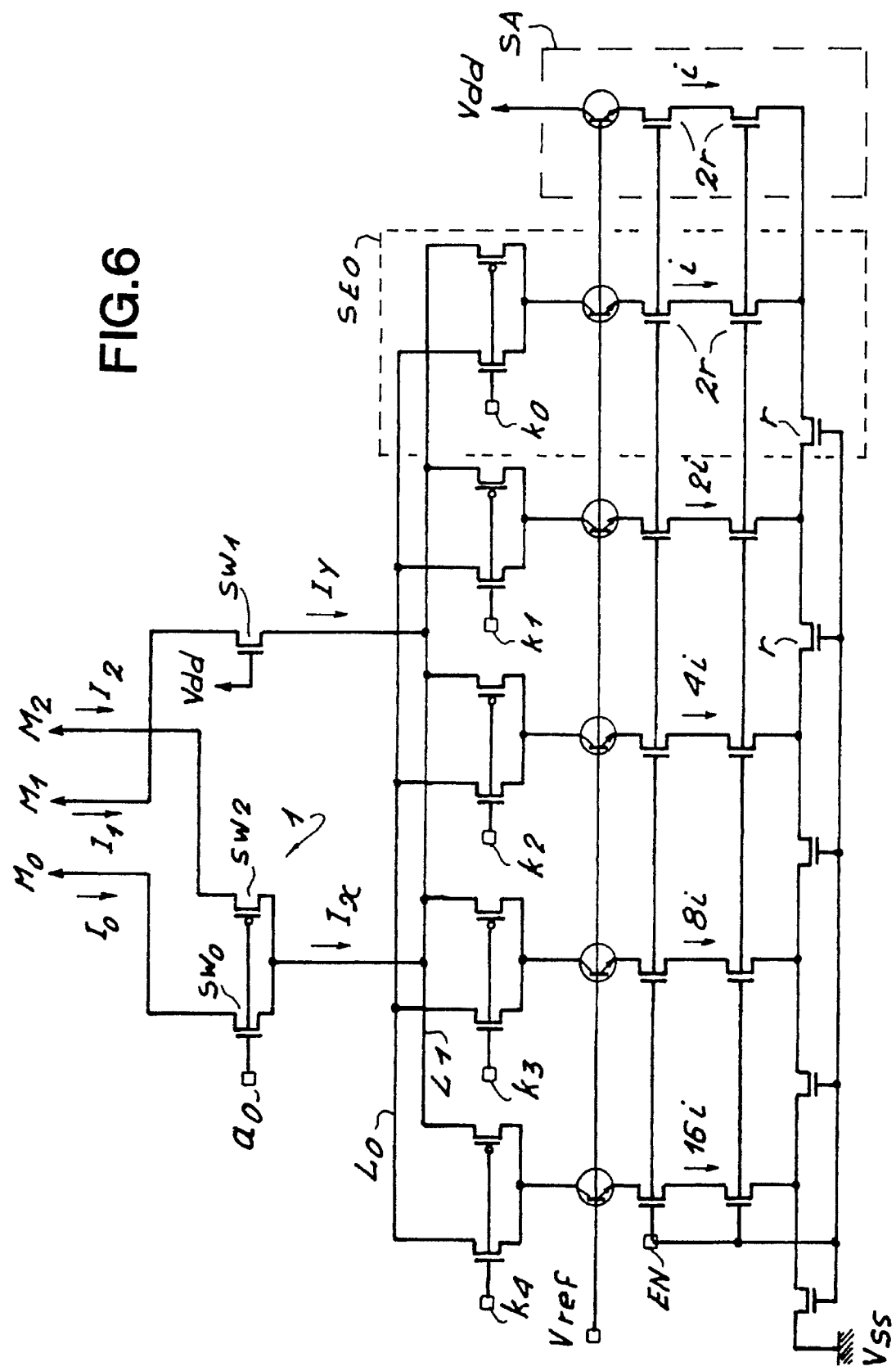

FIG. 6 shows a circuit making it possible to realize the variable currents, I0, I1, I2 as well as the selection means, in particular case where only two adjustment scales are provided.

In this embodiment, the coefficient K is in the form of a binary number NK with 5 bits, represented by the five signals k0–k4, where k0 corresponds to the least significant bit. In this case, K can then assume 32 different values distributed uniformly between 0 and 1 (except for a multiplier coefficient).

Naturally, the embodiments for an arbitrary number of bits will easily be deduced in this particular case.

The circuit includes a first and a second set of resistors whose resistance has the value r and 2r, respectively. The resistors r are realized here by means of n-channel MOS transistors, and the resistors 2r are formed by two n-channel MOS transistors of the same size, connected in series. All these MOS transistors have their gate polarized by the voltage EN which outputs them in the saturated mode.

The circuit includes a first subassembly SA including a bipolar transistor whose collector is connected to the potential Vdd, whose emitter is connected to a first terminal of a resistor 2r, and whose case receives a polarization voltage Vref.

A second subassembly SE0 includes another bipolar transistor, whose base receives the same polarization voltage Vref and whose emitter is connected to a first terminal of another resistor 2r, whose second terminal is connected to the second terminal of the resistor 2r of the subassembly SA, and to a first terminal of a resistor r. The collector of the bipolar transistor is connected to two lines L0 and L1 by way of an n-channel MOS transistor and a p-channel MOS transistor, respectively, whose gates receive the signal k0.

The circuit includes four other subassemblies (not identified by reference numeral) which are identical to SE1, and whose MOS transistors receive the signals k1–k4 at their respective gates. These four subassemblies are connected in the manner indicated in FIG. 6.

The line L0 is connected to module M0 and M2 by way of transistors that play the role of switches SW0 and SW2. The line L1 is connected to the module M1 by way of a switch SW1 embodied by means of an MOS transistor polarized to operate in the saturated mode.

It can easily be verified that the circuit of FIG. 6 furnishes currents Ix and Iy that are proportional to K and 1−K, respectively. On the other hand, the adjustment scale will be selected as a function of a single selection signal a0, if the transistors MOS, SW1 and SW2 associated with the modules M0 and M2 are complementary, as shown in the drawing.

Figure 7:
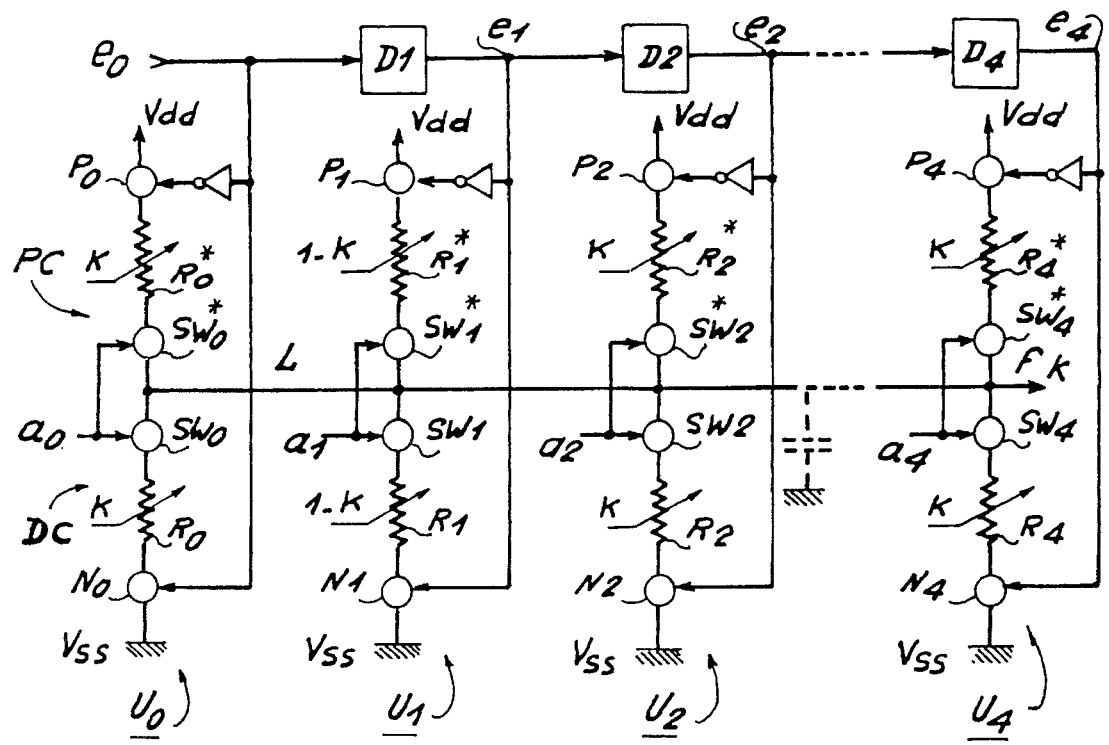
FIG. 7 shows the basic layout of a CMOS embodiment.
Figure 8:
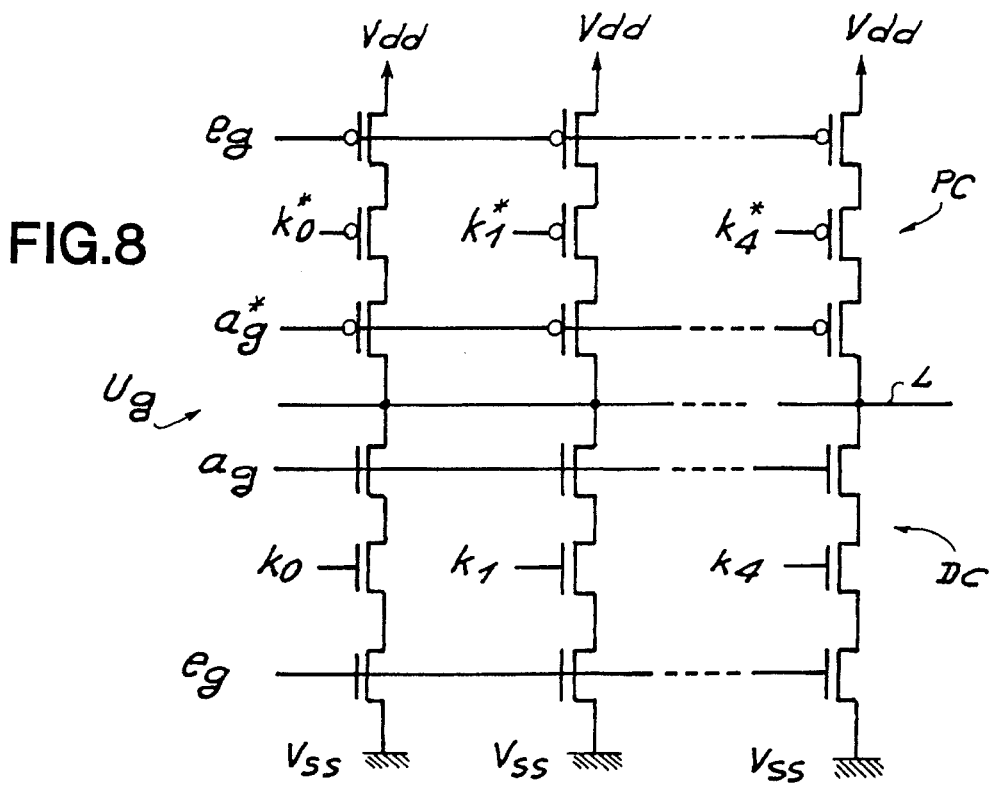
FIG. 8 shows a detailed CMOS embodiment.

FIGS. 7 and 8 relate to a different embodiment, in CMOS technology, of the combination circuit 2.

FIG. 7 is the schematic representation of a CMOS embodiment making its comprehension easier. The circuit includes a plurality of module U0–U4, respectively associated with the signals $e_0$–$e_4$ to effect the charging and discharging of a common line L. Each module is controlled by one of the selection signals a0–a4 and includes a charging circuit PC and a discharging circuit DC, which are controlled by the associated signal. For example, the module U0 associated with the selection signal a0 and the signal e0 includes a charging circuit PC and a discharging circuit DC constituted by a variable resistor R0* or R0 and two switches P0, SW0* or N0*, SW0* controlling the connection by this resistor of the line L to the supply potential Vdd for the charging circuit and Vss for the discharging circuit. The switches SW0 and SW0* are controlled by the selection signal a0 of the module U0. The switch N0 of the discharging circuit is controlled by the signal $e_0$, and the switch P0 is controlled by the complement $e_0^*$ of this signal.

The other modules U1–U4 are identical to the module U0, but they have their switches controlled by the selection signals and the associated delayed signals. On the other hand, the variable resistors R0, R0*, R2, R2*, R4, R4* of even-numbered modules are controlled in such a way as to assume a value that is inversely proportional to the coefficient K, while the odd-numbered resistors R1, R1*, R3, R3* are controlled in such a way as to assume a value inversely proportional to 1−K. The potential of the line L constitutes the measurement of the combination signal $f_K$.

To explain the operation of the circuit of FIG. 7, we will assume that the two first modules U0 and U1 are selected, and that the line L is initially charged to the potential Vdd, with $e_0$ and $e_1$ at 0. The switches P0 and P1 are then closed while the switches N0 and N1 are open.

When the signal $e_0$ becomes active, the switch N0 closes and the switch P0 opens. The circuit then has a time constant defined by the structural capacitance at the level of the line L and a resistance equivalent to the resistors R0 and R1* connected in parallel. Since R0 and R1* are inversely proportional to K and 1−K, respectively, the time constant is independent of K. The line L will then discharge with this time constant, from the value Vdd to the value (1−K)Vdd.

Discharging continues in this way until the moment when the signal $e_1$ becomes active. At that time, the switch N1 closes and the switch P1 opens. The line L then continues to discharge toward 0 with the same time constant as before.

When the signal $e_0$ becomes inactive again, the switch P0 closes and the switch N0 opens, which reestablishes a charging circuit for the line L to the voltage K Vdd. When $e_1$ becomes inactive again, the situation is as at the outset.

It can be verified that the behavior of the circuit of FIG. 7 is identical from the standpoint of the delay to that of the ECL version.

FIG. 8 shows the detailed CMOS embodiment of one of the charging and discharging modules Ug of the circuit of FIG. 7. The charging and discharging circuits are constituted by p- and n-channel MOS transistors, respectively. The variable resistors are embodied by means of MOS transistors connected in parallel and controlled by the signals k0–k4 and k0*–k4*, with the associated switches P0 or N0 being constituted by the drain-to-source paths of respective p- and n-channel MOS transistors whose gates receive the associated signal eg. Similarly, the switches SW0 and SW0* are constituted by the drain-to-source paths of n- and p-channel MOS transistors, respectively, whose gates receive the selection signal ag and its complement ag*, respectively.

The module shown in FIG. 8 is an even-numbered module where the control signals k0–k4, k0*–k4, are applied to the complementary MOS transistors in such a way that there equivalent resistance will be inversely proportional to the coefficient K. The odd-numbered modules are identical, except for the difference that the signals k0–k4 are replaced with k0*–k4*, respectively, and vice versa.

The fixed delay circuits D1–D4 are each embodied by means of two cascade-connected CMOS inverters.

The structural capacity defining the time constant is due to the drain-to-source capacitances of the active MOS transistors connected to the line L. By the design of the circuit, the resultant structural capacitance remains constant, regardless of the value of K.

On the other hand, the MOS transistors constituting the variable resistors of each charging or discharging circuit may be dimensioned in such as way that their resistances vary by a power of 2, depending on the weight or significance of the control signals k0, . . . , k4, . . . , k0*, . . . , k4*.

Another possibility is to replace the variable-sized transistors with parallel and serial arrays of identical transistors.

The operation of the circuit of FIG. 8 is identical in principle to that of FIG. 7 and hence requires no additional explanation.

Figure 9:
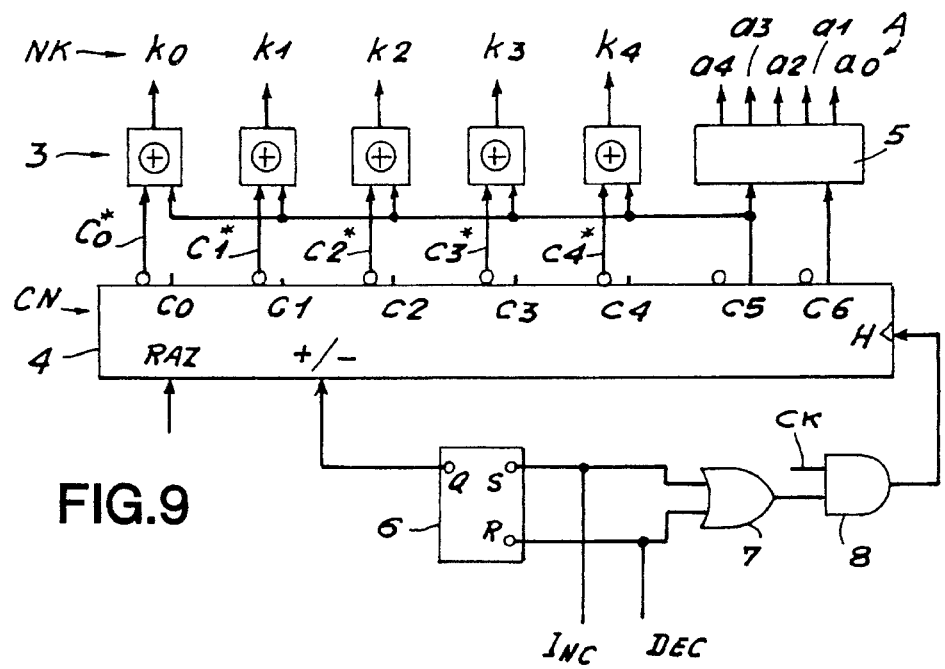
FIG. 9 shows a control circuit for the delay circuit of the invention.

FIG. 9 shows an embodiment of the control circuit 3 as well as means for producing the digital command CN.

According to this version, the digital command CN is a binary digital variable defined by the state of an up-down counter 4, which for example has a capacity of 7 bits c0–c6. The most significant bits c5 and c6 define the adjustment scale, while the least significant bits c0–c4 are representative of the weighting coefficient K. The state of the counter 4 may be incremented or decremented in response to the signals INC or DEC, respectively. The signals INC and DEC are applied to the inputs for setting to 1 and 0, respectively, of a flip flop 6 whose output is applied to the incrementation/decrementation control input of the counter 4. The signals INC and DEC are also applied to the inputs of an OR gate 7, whose output is connected to the input of an AND gate 8, whose second input receives a clock signal CK. The output of the AND gate 8 is connected to the clock input H of the counter 4.

The control signals k0–k4 that represent the weighting coefficient K are furnished by EXCLUSIVE OR gates, of which a first input receives the bit c5 of the counter 4, and whose second input receives one of the complements c0*–c4* of the least significant bits c0–c4 of the counter 4.

The selection signals a0–a4 are furnished by a decoder 5 of the most significant bits c5, c6. The decoder 5 will be embodied for example by means of a combinatorial logic circuit, designed for verifying the following truth table:

| C6 | C5 | a0 | a1 | a2 | a3 | a4 |
|---|---|---|---|---|---|---|
| 0 | 0 | 1 | 1 | 0 | 0 | 0 |
| 0 | 1 | 0 | 1 | 1 | 0 | 0 |
| 1 | 0 | 0 | 0 | 1 | 1 | 0 |
| 1 | 1 | 0 | 0 | 0 | 1 | 1 |

The operation of the circuit of FIG. 9 will now be described in conjunction with the diagrams of FIG. 10.

The orders of modification of the state of the counter 4 appear in the form of two signals INC and DEC, controlling the incrementation and decrementation of the counter, respectively. The output of the OR gate 7 is accordingly representative of a modification request. This request is synchronized by a clock signal CK by means of the AND gate 8, whose output furnishes the synchronization signal for the counter 4.

When the signal INC is at 1, the output Q of the flip flop 6 assumes the value 1, which prepares the counter 4 for the incrementation, which is effective upon the appearance of the clock signal CK. Conversely, when DEC is at 1, the output Q is forced to 0, and the counter 4 is prepared for the decrementation.

Figure 10A:
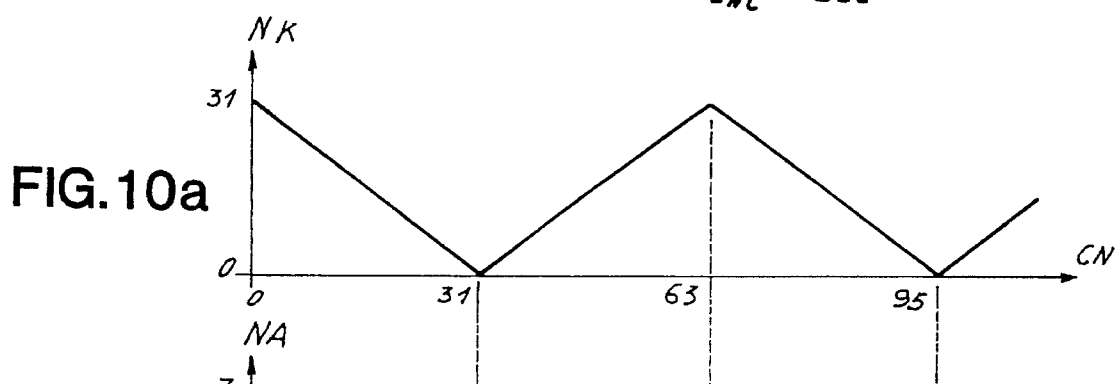
FIG. 10 shows diagrams to explain the operation of the control circuit of FIG. 9.
Figure 10B:
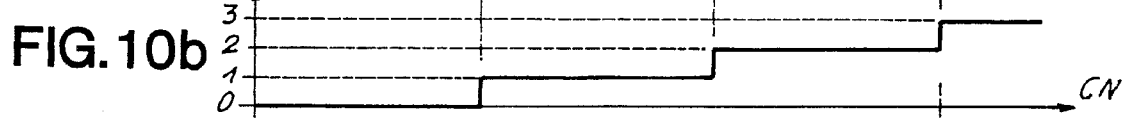
Figure 10C:
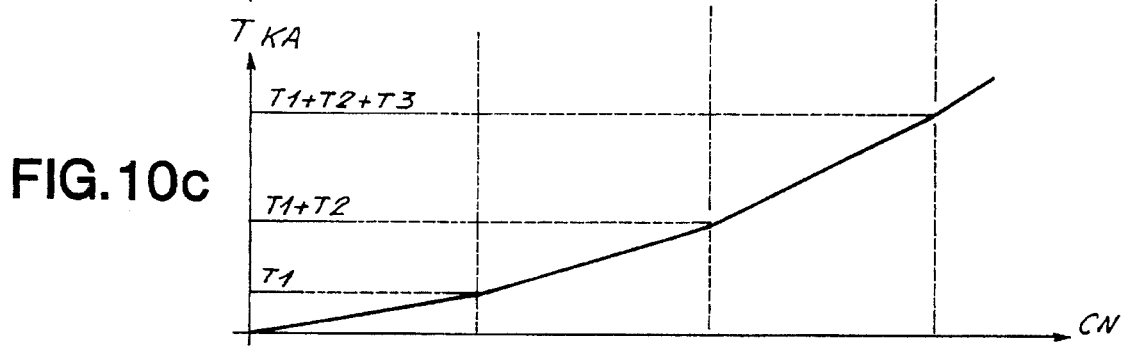

FIG. 10($a$) shows the variations in the digital variable NK representing the weighting coefficient K and physically embodied by the signals k0–k4 furnished at the output of the control circuit 3. As a result of the assembly, the variation in NK as a function of CN changes direction when c5 changes its binary value. Each of these changes corresponds to the passage from one scale to another, as in FIG. 10($b$), which shows the variations in the scale number NA as a function of the set point CN.

FIG. 10($c$) shows the variations in the global delay TKA (measured from time t1 defined above) as a function of the digital command CN. For each scale, the adjustment range is equal to the value of the corresponding fixed delay. This presents the possibility of varying the slope of the curve representing the delay $T_{KA}$ as a function of CN, in accordance with the value of CN as shown in this figure. This possibility is worth exploiting, if it is desired that the precision of the adjustment be varied as a function of the value of the digital command CN. This will be the case, for example, if the circuit using the delay circuit according to the invention must be arranged to function at very different frequencies.

I claim:

1. A method for furnishing an output signal ($s_K$) having a delay (θ) with respect to an input logic signal ($e_0$), said delay (θ) being adjustable as a function of a digital command (CN) having most and least significant bits, said method comprising the steps of producing a succession of delayed signals ($e_1, e_2, \ldots, e_n$) delayed with respect to the input signal ($e_0$), said delayed signals being produced in such a way that the delay between the delayed signal ($e_2$) and the preceding signal ($e_1$) have a predetermined value; producing binary signals ($a_0, a_1, a_2, \ldots, a_n$) as a logical combination of the most significant bits of said digital command (CN); selecting one of said delayed signals ($e_2$) in response to a state of one of said binary signals ($a_2$) and the preceding signal ($e_1$) in response to a state of another one of said binary signals ($a_1$); and performing a superposition with weighting and an integral effect of said selected signals ($e_1$, $e_2$), said weighting being determined by the least-significant bits of said digital command (CN).

2. A method for furnishing an output signal ($s_K$) having a delay ($\theta$) with respect to an input logic signal ($e_0$), said delay ($\theta$) being adjustable as a function of a digital command (CN) having most and least significant bits, said method comprising the steps of producing a succession of delayed signals ($e_1, e_2, \ldots, e_n$) delayed with respect to the input signal ($e0$), said delayed signals being produced in such a way that the delay between the delayed signal ($e_2$) and the preceding signal ($e_1$) have a predetermined value; selecting one of said delayed signals ($e_2$) and the preceding signal ($e_1$) by using the most significant bits of said digital command (CN); and performing a superposition with weighing and an integral effect of said selected signals ($e_1$, $e_2$), said weighing being determined by the least-significant bits of said digital command (CN), wherein said weighing comprises the step of assigning two complementary weighing coefficients (K, 1–K), respectively, to the two signals selected ($e_1$, $e_2$), wherein said weighing coefficients have values which are between 0 and a maximum value.

3. The method of claim 2, wherein for an initial given selection of a delayed signal ($e_2$) and of the preceding signal ($e_1$), when the weighting coefficient of the delayed signal ($e_2$) has said maximum value while the digital command is increasing, said selection is modified in such a way as to replace said preceding signal ($e_1$) with the signal ($e_3$) following said delay signal ($e_2$), and that when the weighting coefficient of said preceding signal ($e_1$) is 0 while the digital command is decreasing, said selection is modified in such a way as to replace said delayed signal ($e_2$) with the signal ($e_0$) preceding said preceding signal ($e_1$).

4. A delay circuit for furnishing an output signal ($s_k$) having a delay ($\theta$) with respect to a logical input signal ($e_0$), said delay ($\theta$) being adjustable as a function of a digital command (CN), said circuit comprising a plurality of fixed delay circuits (D1, D2, ..., Dn) connected in cascade fashion, the first of said fixed delay circuits (D1) receiving said input signal ($e_0$) at its input, said fixed delay circuits (D1, D2, ..., Dn) furnishing a succession of delayed signals ($e_1, e_2, \ldots, e_n$); selection means (1) comprising switches (SW0, SW1, SW2, ..., SWn) for selecting in direct response to a digital signal one of said delayed signals ($e_2$) and the preceding signal ($e_1$); and combination means (2) connected by one of said switches (SW2) to an output of one of said delay circuits (D2) and by a preceding one of said switches (SW1) to an input of said delay circuit (D2) for furnishing a combination signal ($f_k$) resulting from the superposition with weighting and an integral effect of said selected signals ($e_1$, $e_2$), said selection means (1) and combination means (2) being separately controlled by a control circuit (3) as a function of said digital command (CN).

5. A delay circuit for furnishing an output signal ($s_K$) having a delay ($\theta$) with respect to a logical input signal ($e_0$), said delay ($\theta$) being adjustable as a function of a digital command (CN), said circuit comprising a plurality of fixed delay circuits (D1, D2, ..., Dn) connected in cascade fashion, the first of said fixed delay circuits (D1) receiving said input signal ($e_0$) at its input, said fixed delay circuits (D1, D2, ..., Dn) furnishing a succession of delayed signals ($e_1, e_2, \ldots, e_n$); selection means (1) for selecting one of said delayed signals ($e_2$) and the preceding signal ($e_1$); and combination means (2) for furnishing a combination signal ($f_K$) resulting from the superposition with weighing and an integral effect of said selected signals ($e_1$, $e_2$), said selection means (1) and combination means (2) being controlled by a control circuit (3) as a function of said digital command (CN), wherein said weighing consists in assigning first and second complementary weighing coefficients (K, 1–K), respectively, to the two signals selected ($e_1$, $e_2$) as a function of said digital command (CN), which are between 0 and a maximum value.

6. The delay circuit of claim 5, wherein said control circuit (3) produces selection signals (a0, a1, ..., a4) applied to said selection means (1) and combination means, and that for a delayed signal ($e_2$) and a preceding signal ($e_1$) that are selected, said control circuit assigned said delay signal ($e_2$) a weighting coefficient (K, 1–K) that varies in accordance with an increasing function of said digital command (CN).

7. The delay circuit of claim 6, wherein said combination means (2) include a common impedance (Z) and a first and second current source (Sx, Sy) furnishing currents, (Ix, Iy), respectively, that are proportional to said first and second weighting coefficients (K, 1–K); said combination means (2) includes a plurality of switch means (Q0, Q1, ..., Q4) controlled respectively by said input signal ($e_0$) and said delay signals ($e_1, \ldots, e_4$); said switch means associated with the input signal ($e_0$) and the even-numbered delay signals ($e_2, \ldots, e_4$) are disposed between a terminal of said common impedance (Z) and the first current source (Sx) by way of said selection means (1); said switch means associated with the odd-numbered signals ($e_1$, $e_3$) are disposed between a terminal of said common impedance (Z) and the second current source (Sy) by way of said selection means (1); and wherein said first weighting coefficient (K) varies in accordance with a decreasing or increasing function, respectively, of said digital command (CN), depending on whether the delayed signal selected is odd- or even-numbered, respectively.

8. The delay circuit of claim 6, wherein said input signal ($e_0$) and said delayed signals ($e_1$) are differential signals ($e_0$, $e_0$* and $e_1$, $e_1$*, ..., $e_n$, $e_n$*, respectively); said combination means (2) includes a first and a second resistor (R, R*) each having a first terminal connected to a supply potential (Vdd); said combination means (2) includes a first and a second current source furnishing currents (Ix, Iy), respectively, that are proportional to said first and second weighting coefficients (K, 1–k) and a plurality of differential arrays associated respectively with the input signal ($e_0$, $e_0$*) and with the delayed signals ($e_1$, $e_1$*, ..., $e_n$, $e_n$*), each differential array (M0, M1, M2) being formed by two bipolar transistors (Q0, Q0*, ..., Q2, Q2*), whose collectors are connected respectively to a second terminal of said first and second resistors (R, R*) and whose bases receive the associated differential signals ($e_0$, $e_0$*, ..., $e_2$, $e_2$*); the emitters of the bipolar transistors (Q0, Q0*, ..., Q2, Q2*) of the differential arrays (M0, M2) associated with the input signal ($e_0$, $e_0$*) and with the even-numbered delayed signals ($e_2$, $e_2$*) are connected to said first current source; the emitters of the bipolar transistors (Q1, Q1*) of the differential arrays (M1) associated with the odd-numbered delayed signals ($e_1$, $e_1$*) are connected to said second current source; and said first weighting coefficient (K) varies in accordance with a decreasing or increasing function, respectively, of said digital command (EN), depending on whether said delayed signal selected is odd- or even-numbered, respectively.

9. The delay circuit of claim 6, wherein said combination means (2) includes a plurality of charging and discharging modules ($U_0$, U1, ..., U4) of a common line (L) that are controlled respectively by the input signal ($e_0$) and the delayed signals ($e_1, \ldots, e_4$), the potential of said common line (L) constituting said combination signal ($f_K$); each module (U0, U1, ..., U4) includes a discharging circuit (DC) and a charging circuit (PC), respectively, each including first and second switch means (P0, N0, SW0, . . . , P4, N4, SW4) controlling the connection between said common line (L) and a first and second supply potential (Vss, Vdd), respectively, by way of a variable resistor, the variable resistor of the discharging and charging circuits (DC and PC, respectively) of the modules (U0, . . . , U4) associated with the input signal ($e_0$) and with the even-numbered delayed signals ($e_2$, . . . , $e_4$) being controlled in such a way as to assume a value that is inversely proportional to said first weighting coefficient (K), the variable resistor of the discharging and charging circuits (DC and PC, respectively), of the modules (U1, . . . , U3) associated with the odd-numbered delayed signals ($e_1$, $e_3$) being controlled in such a way as to assume a value that is inversely proportional to said second weighting coefficient (1−K); said first switch means (P0, N0, . . . , P4, N4) of the discharging circuit (DC) and of the charging circuit (PC) of each module (U0, . . . , U4) are activated respectively by a first and a second voltage level of the associated signal ($e_0$, . . . , $e_4$); the set of said second switch means (SW0, . . . , SW4) constitutes said selection means (1); and said first weighting coefficient (K) varies by a decreasing or increasing function, respectively, of said digital command (CN), depending on whether said delayed signal selected is odd- or even-numbered, respectively.

* * * * *

UNITED STATES PATENT AND TRADEMARK OFFICE
CERTIFICATE OF CORRECTION

PATENT NO. : 5,521,540
DATED : May 28, 1996
INVENTOR(S) : Roland MARBOT

It is certified that error appears in the above-indentified patent and that said Letters Patent is hereby corrected as shown below:

Col. 11, lines 15, 16, 18, 19, and 21 (Claim 2, lines 12, 13, 15, 16, and 18): "weighing" should be --weighting--, Col. 11, line 65 (Claim 5, line 12): "weighing" should be --weighting--, Col. 12, lines 2 and 3 (Claim 5, lines 16 and 17): "weighing" should be --weighting--.

Signed and Sealed this

Third Day of December, 1996

Attest:

BRUCE LEHMAN

Attesting Officer    Commissioner of Patents and Trademarks